(12) United States Patent
Ueda et al.

(10) Patent No.: US 10,527,683 B2
(45) Date of Patent: Jan. 7, 2020

(54) MAGNETIC SENSOR DEVICE

(71) Applicant: TDK Corporation, Tokyo (JP)

(72) Inventors: Kunihiro Ueda, Tokyo (JP); Koichi Otani, Tokyo (JP); Hiraku Hirabayashi, Tokyo (JP); Shuhei Miyazaki, Tokyo (JP)

(73) Assignee: TDK Corporation, Tokyo (JP)

( * ) Notice: Subject to any disclaimer, the term of this patent is extended or adjusted under 35 U.S.C. 154(b) by 118 days.

(21) Appl. No.: 15/921,969

(22) Filed: Mar. 15, 2018

(65) Prior Publication Data

US 2018/0275204 A1    Sep. 27, 2018

(30) Foreign Application Priority Data

Mar. 27, 2017  (JP) .................. 2017-061980

(51) Int. Cl.
| | | |
|---|---|---|
| *G01R 33/00* | (2006.01) | |
| *G01R 33/09* | (2006.01) | |
| *G01R 33/07* | (2006.01) | |
| *G01R 33/12* | (2006.01) | |

(52) U.S. Cl.
CPC ..... *G01R 33/0047* (2013.01); *G01R 33/0005* (2013.01); *G01R 33/07* (2013.01); *G01R 33/09* (2013.01); *G01R 33/1276* (2013.01); *H01L 2224/48247* (2013.01)

(58) Field of Classification Search
None
See application file for complete search history.

(56) References Cited

U.S. PATENT DOCUMENTS

2010/0141249 A1*  6/2010  Ararao ............... G01R 33/0047
324/244

FOREIGN PATENT DOCUMENTS

| JP | 2009-36579 A | 2/2009 |
|---|---|---|
| JP | 2016-70848 A | 5/2016 |

* cited by examiner

*Primary Examiner* — Paresh Patel
(74) *Attorney, Agent, or Firm* — Posz Law Group, PLC

(57) ABSTRACT

A magnetic sensor device comprises a magnetic sensor chip that has a substantially rectangular shape and that contains a magnetic sensor element; and a sealing body, which is composed of a resin material containing magnetic particles and that integrally seals the chip. The chip includes a first and second side surfaces which are mutually opposite to each other, and a third and fourth side surfaces which are mutually opposite to each other and orthogonal to the first and second side surfaces. The sealing body contains first to forth sealing parts. The thicknesses of the first and second sealing parts are smaller than the particle diameter of the particles, and the thickness of at least the third sealing part is larger than the particle diameter of the particles. The particles exist in at least the third sealing part and substantially do not exist in the first and second sealing parts.

13 Claims, 6 Drawing Sheets

MAGNETIC SENSOR DEVICE

CROSS REFERENCE TO RELATED APPLICATIONS

The present application is based on Japanese Patent Application No. 2017-61980 filed on Mar. 27, 2017, the disclosure of which is incorporated herein by reference.

FIELD OF THE INVENTION

The present invention relates to a magnetic sensor device.

BACKGROUND OF THE INVENTION

In recent years, physical quantity detection devices for detecting physical quantities have been used in a variety of applications. As such physical quantity detection devices, ones that are equipped with a magnetic sensor device capable of detecting external magnetic fields are known, and from the magnetic sensor device, a signal corresponding to the external magnetic field is output.

As the magnetic sensor device, a magnetic sensor package which has a magnetic sensor chip including a magnetic sensor element that detects the detected magnetic field, and a sealing body for integrally sealing the sensor chip is used. As the magnetic sensor element included in the magnetic sensor chip, magnetoresistive effect elements (AMR elements, GMR elements, TMR elements and the like), the resistance of which changes in accordance with the external magnetic field, and Hall elements that use the so-called Hall effect, and the like, have been known.

Physical quantity detection devices are, for example, installed in electronic equipment such as mobile phones. In this kind of electronic equipment, there are magnetic influences caused by various interfering magnetic fields, and to improve noise resistance to these interfering magnetic fields, a magnetic sensor package having a magnetic shield has been proposed (see Patent Literature 1 and 2). In addition, in a magnetic sensor device in which an electronic compass or the like that detects geomagnetism with a weak magnetic field intensity is used to detect the geomagnetism having weak magnetic field intensity with high precision, a magnetic yoke is provided, and the magnetic field to be detected is focused on the magnetic sensor chip (magnetic sensor element) by the magnetic yoke.

PRIOR ART

Patent Literature

[PATENT LITERATURE 1] JP Laid-Open Patent Application No. 2016-70848
[PATENT LITERATURE 2] JP Laid-Open Patent Application No. 2009-36579

SUMMARY OF THE INVENTION

Problem to be Solved by the Invention

In the above-described magnetic sensor package, by providing a magnetic shield, it is possible to weaken interfering magnetic fields with respect to the magnetic sensor element included in the sensor chip and to improve noise resistance by interfering magnetic fields. However, in the magnetic sensor package, adjusting the magnetic field intensity of the magnetic field to be detected is difficult. For example, when the magnetic field to be detected in the magnetic sensor package is a magnetic field in the X-axis direction and the interfering magnetic field is a magnetic field in the Y-axis direction, in the above-described magnetic sensor package, it is possible to reduce the magnetic field intensity of the magnetic field in the Y-axis direction, but it is extremely difficult to increase or reduce the magnetic field intensity of the magnetic field in the X-axis direction. In general, the magnetic sensor element in the magnetic sensor package has a prescribed useable magnetic field range, and when the magnetic field intensity of the magnetic field in the X-axis direction to be detected is outside this usable magnetic field range, it is necessary to adjust the magnetic field intensity of the magnetic field (the magnetic field intensity of the magnetic field applied on the magnetic sensor element). In the above-described magnetic sensor package, it is difficult to adjust the magnetic field intensity of the magnetic field in the X-axis direction, so the problem exists that application is possible only in environments in which the magnetic field intensity of the magnetic field is within the usable magnetic field range of the magnetic sensor element.

In addition, by providing the magnetic yoke in the above-described magnetic sensor package, it is possible to focus the magnetic field with weak magnetic field intensity to be detected on the magnetic sensor element. However, in this magnetic sensor package, it is difficult to adjust the magnetic field intensity of a magnetic field in a direction differing from the direction of the magnetic field to be detected. For example, when the magnetic field to be detected in the magnetic field sensor package is a magnetic field in the X-axis direction and the magnetic field in a direction differing therefrom is a magnetic field in the Y-axis direction, in the above-described magnetic field sensor package, it is possible to increase the magnetic field intensity of the magnetic field in the X-axis direction, but it is extremely difficult to increase or reduce the magnetic field intensity of the magnetic field in the Y-axis direction.

Since the magnetic sensor package is provided with a magnetic shield and a magnetic yoke, it is thought to be possible to adjust the magnetic field intensity of magnetic fields in mutually differing directions. However, by providing both a magnetic shield and a magnetic yoke, the size of the magnetic sensor package becomes large and there is also a problem that the manufacturing cost of the magnetic sensor package increases.

In consideration of the foregoing, it is an object of the present invention to provide a magnetic sensor device that can adjust the magnetic field intensity of a magnetic field in at least one direction among magnetic fields in mutually differing directions, that has compact size and that can be manufactured inexpensively.

Means for Solving the Problem

In order to resolve the above-described problem, the present invention provides a magnetic sensor device that is provided with a magnetic sensor chip that has a substantially rectangular shape in a plan view and that contains a magnetic sensor element and a sealing body, which is composed of a resin material containing magnetic particles and that integrally seals the magnetic sensor chip. In the plan view of the magnetic sensor chip, the magnetic chip includes a first side surface and a second side surface, which are mutually opposite to each other, and a third side surface and a fourth side surface, which are mutually opposite to each other and orthogonal to the first side surface and the second side surface. The sealing body contains a first sealing part, which is positioned on the first side surface, a second sealing part, which is positioned on the second side surface, a third sealing part, which is positioned on the third side surface, and a fourth sealing part, which is positioned on the fourth side surface. The thicknesses of the first sealing part and the second sealing part are smaller than the particle diameter of the magnetic particles, and the thickness of at least the third sealing part is larger than the particle diameter of the magnetic particles. The magnetic particles exist in at least the third sealing part and substantially do not exist in the first sealing part and the second sealing part.

With the above-described magnetic sensor device, since the thicknesses of the first sealing part and the second sealing part, which are positioned on the first side surface and the second side surface of the magnetic sensor chip, are smaller than the particle diameter of the magnetic particles, it is possible to prevent the magnetic particles from being present inside the first sealing part and inside the second sealing part. Furthermore, since the magnetic particles exist inside the third sealing part, it is possible for a magnetic shield function with respect to a magnetic field in the direction between the first side surface and the second side surface and/or a magnetic yoke function with respect to a magnetic field in the direction between the third side surface and the fourth side surface to be exerted, so it is possible to adjust the magnetic field intensity of the magnetic field in at least one direction among magnetic fields in mutually differing directions. Through this, it is not necessary to provide the magnetic shield and the magnetic yoke and the like separately, so it is possible to make the size of the magnetic sensor device compact and to also enable inexpensive manufacturing.

In this invention, the phrase "the magnetic particles substantially do not exist in the first sealing part and the second sealing part" means that magnetic particles are permitted to exist in the first sealing part and the second sealing part as long as the magnetic shield function with respect to the magnetic field in the direction between the first side surface and the second side surface and the magnetic yoke function with respect to the magnetic field in the direction between the third side surface and the fourth side surface are exerted.

In the above-described magnetic sensor device, the direction of a sensitivity axis of the magnetic sensor element is a direction intersecting the first side surface and the second side surface. The magnetic sensor chip further includes a top surface and a bottom surface, which are mutually opposite to each other. The sealing body further contains a fifth sealing part, which is positioned on the top surface side, and a sixth sealing part, which is positioned on the bottom surface side. The thicknesses of the fifth sealing part and the sixth sealing part are smaller than the particle diameter of the magnetic particles. The magnetic particles substantially do not exist in the fifth sealing part and the sixth sealing part. In this case, the content ratio of the magnetic particles and the resin material in the third sealing part is preferably 80:20~25:75 on a mass standard.

In addition, in the above-described magnetic sensor device, the direction of a sensitivity axis of the magnetic sensor element may be a direction intersecting the third side surface and the fourth side surface. In this case, the content ratio of the magnetic particles and the resin material in the third sealing part is preferably 70:30~20:80 on a mass standard.

In the above-described magnetic sensor device, the magnetic sensor chip further includes a top surface and a bottom surface, which are mutually opposite each other. The sealing body further contains a fifth sealing part, which is positioned on the top surface side, and a sixth sealing part, which is positioned on the bottom surface side. The thicknesses of the fifth sealing part and the sixth sealing part are smaller than the particle diameter of the magnetic particles. The magnetic particles substantially do not exist in the fifth sealing part and the sixth sealing part, or the thicknesses of the fifth sealing part and the sixth sealing part are larger than the particle diameter of the magnetic particles, and the magnetic particles may exist in the fifth sealing part and the sixth sealing part. When the magnetic particles exist in the fifth sealing part and the sixth sealing part, the content ratio of the magnetic particles and the resin material in the fifth sealing part and the sixth sealing part is preferably 70:30~20:80 on a mass standard.

In the above-described magnetic sensor device, the thickness of the fourth sealing part is larger than the particle diameter of the magnetic particles. The magnetic particles can also exist in the fourth sealing part, and the particle diameter of the magnetic particles can be set at least 200 μm. The resin material can be epoxy resin, styrene resin or ABS resin. The magnetic sensor chip may contain a magnetoresistance effect element as the magnetic sensor element, for example, a Hall element, an AMR element, a GMR element or a TMR element.

Effects of the Invention

With the present invention, it is possible to provide a magnetic sensor device that can adjust the magnetic field intensity of a magnetic field in at least one direction among magnetic fields in mutually differing directions, that has compact size, and that can be manufactured inexpensively.

DETAILED DESCRIPTION OF THE INVENTION

Figure 1:
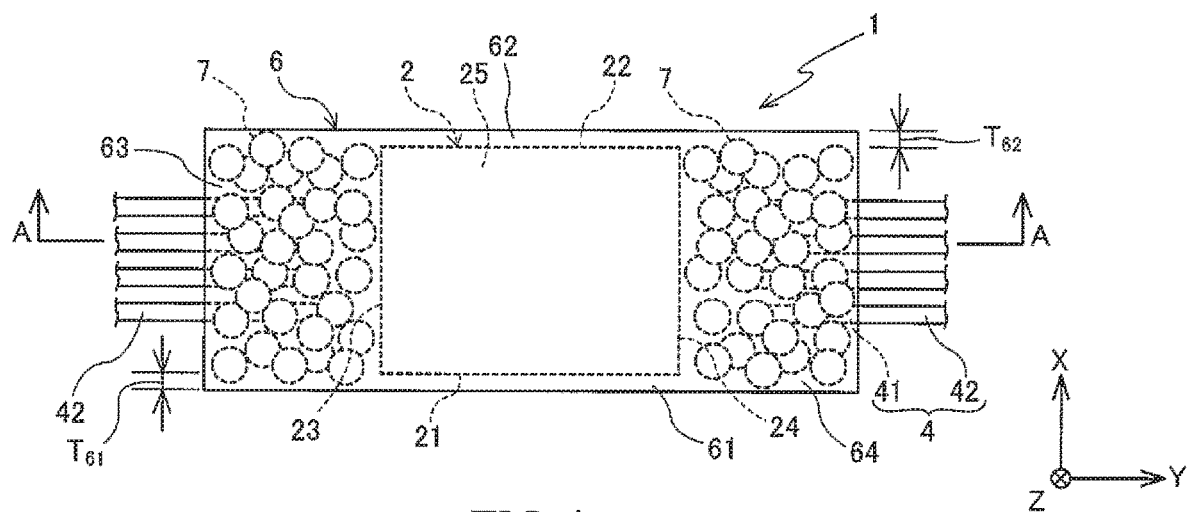
FIG. 1 is a plan view showing the schematic configuration of a magnetic sensor device according to an embodiment of the present invention.
Figure 2:
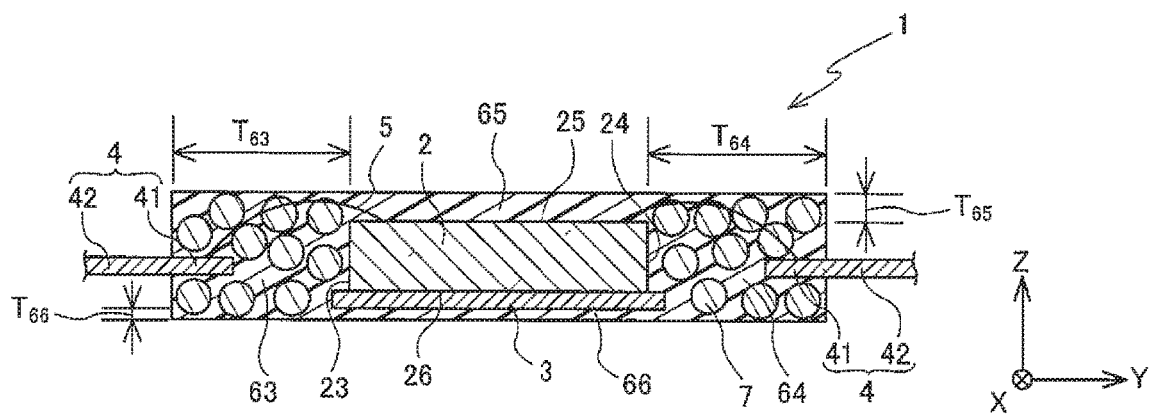
FIG. 2 is a cross-sectional view along line A-A in FIG. 1, showing the schematic configuration of the magnetic sensor device according to an embodiment of the present invention.
Figure 3:
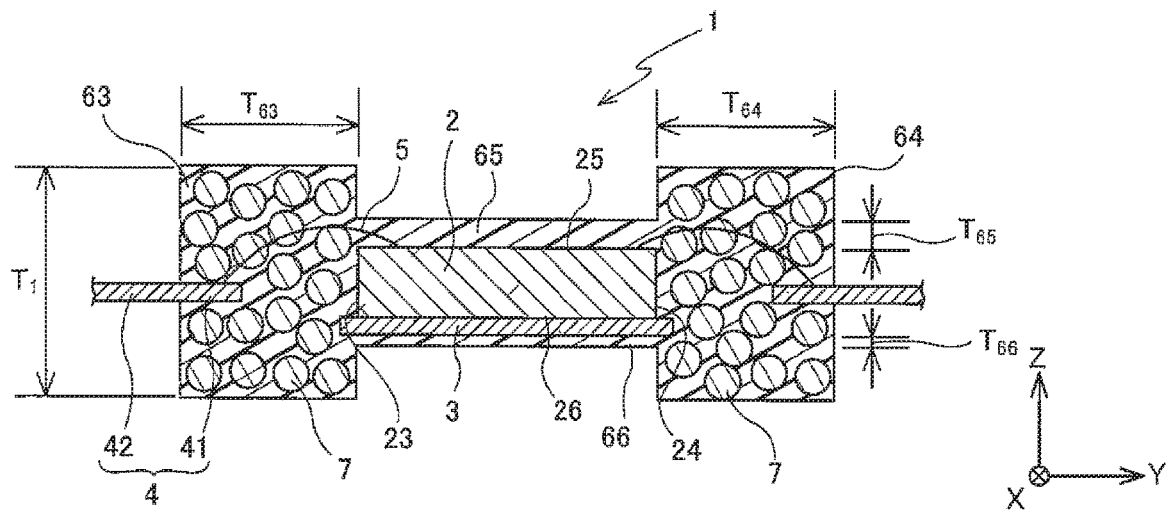
FIG. 3 is a cross-sectional view showing the schematic configuration of another aspect of the magnetic sensor device according to an embodiment of the present invention.
Figure 4:
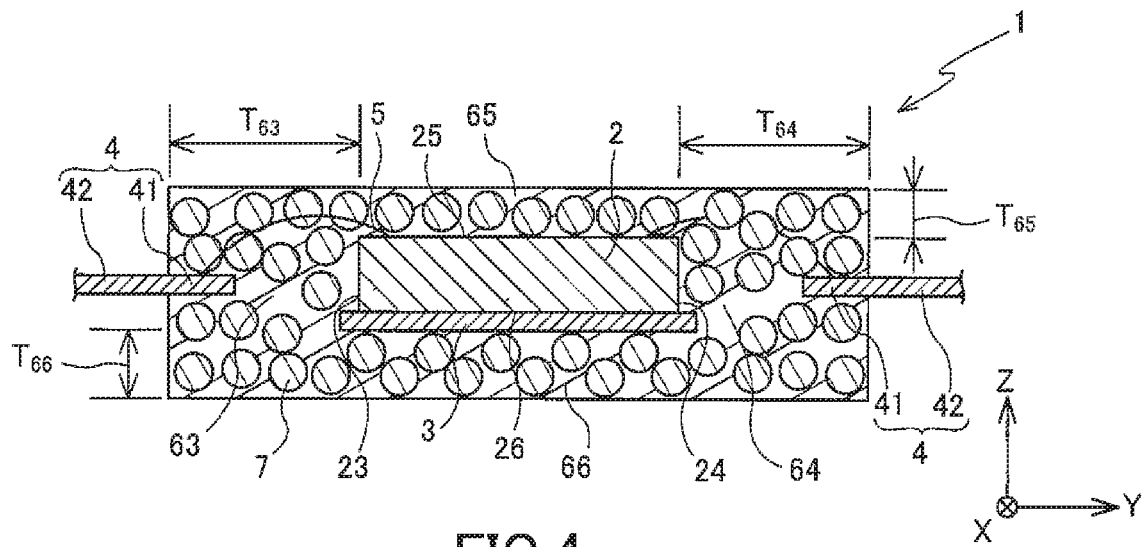
FIG. 4 is a cross-sectional view showing the schematic configuration of another aspect of the magnetic sensor device according to an embodiment of the present invention.
Figure 5:
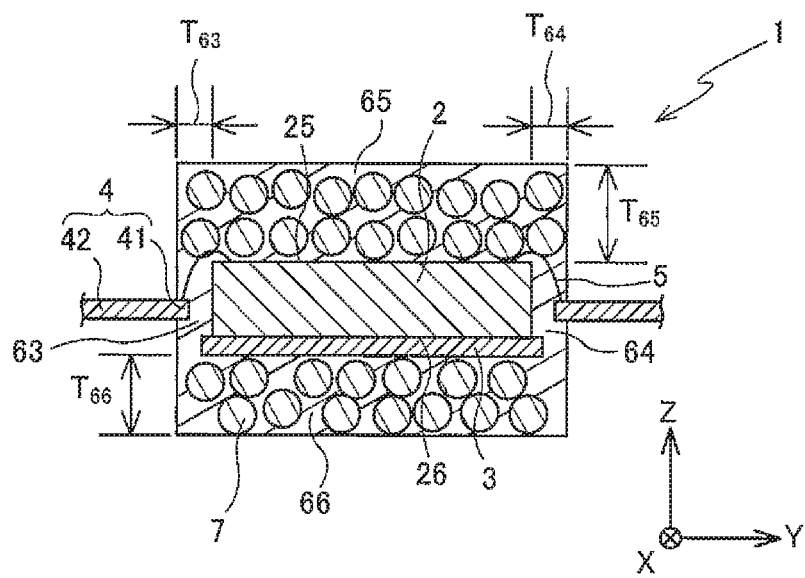
FIG. 5 is a cross-sectional view showing the schematic configuration of another aspect of the magnetic sensor device according to an embodiment of the present invention.

An embodiment of the present invention will be described with reference to the drawings. FIG. 1 is a plan view showing the schematic configuration of a magnetic sensor device according to the embodiment, FIG. 2 is a cross-sectional view along line A-A in FIG. 1 showing the schematic configuration of the magnetic sensor device according to the embodiment, and FIG. 3 through FIG. 5 are cross-sectional views showing the schematic configuration of other aspects of the magnetic sensor device according to the embodiment. In the magnetic sensor device according to the embodiment, in a number of the drawings, the "X-, Y- and Z-axis directions" are stipulated as necessary. Here, the X-axis direction and the Y-axis direction are mutually orthogonal directions in the plane of the magnetic sensor chip, and the Z-axis direction is the thickness direction of the magnetic sensor chip.

As shown in FIG. 1 and FIG. 2, a magnetic sensor device 1 according to this embodiment is provided with a die pad 3 having a mounting surface on which a magnetic sensor chip 2 is mounted, the magnetic sensor chip 2 fixed on the mounting surface of the die pad 3 by a conductive paste, an insulating paste, a DAF (die attach film) or the like, a plurality of leads 4 (8 in this embodiment) positioned around the die pad, each including an inner lead 41 and an outer lead 42, a wiring part 5 made by bonding wire or the like made of gold wire or the like and electrically connecting terminals of the electric sensor chip 2 and the inner leads 41, and a sealing body 6 that integrally seals the magnetic sensor chip 2, the die pad 3, the wiring part 5 and the inner leads 41.

The magnetic sensor chip 2 has a substantially rectangular shape in the plan view and has a first side surface 21 and a second side surface 22, which are mutually opposite to each other, a third side surface 23 and a fourth side surface 24, which are mutually opposite to each other and orthogonal to the first side surface 21 (second side surface 22), a bottom surface 26, which contacts the mounting surface of the die pad 3, and a top surface 25, which is opposite to the bottom surface 26. A sensitivity axis (sensitivity axis of the magnetic sensor element) of the magnetic sensor chip 2 may be in the direction between the first side surface 21 and the second side surface 22 (the X-axis direction), may be in the direction between the third side surface 23 and the fourth side surface 24 (the Y-axis direction), or may be in the direction between the top surface 25 and the bottom surface 26 (the Z-axis direction).

The sealing body 6 is composed of a resin (for example, epoxy resin, styrene resin, ABS resin or the like) that seals the magnetic sensor chip 2 as one body and contains magnetic particles 7. As described below, since the magnetic particles 7 are mixed into the sealing body 6, the functions of a magnetic yoke or a magnetic shield with respect to the magnetic sensor chip 2 are exerted. From this perspective, the magnetic particles 7 are preferably composed of a soft magnetic material having a relatively high magnetic permeability (for example, a magnetic permeability of around $2 \times 10^{-5} \sim 8 \times 10^4$ (H/m)) and spinel ferrites such as MnZn ferrite, NiZn ferrite, CuZn ferrite or the like, hexagonal ferrites such as barium ferrite, strontium ferrite or the like, garnet ferrites such as yttrium iron garnet (YIG) or the like; or $\gamma$-$Fe_2O_3$ (Maghemite), and the like are examples.

The particle diameter of the magnetic particles 7 is not particularly limited, but, for example, may be 200 μm or more, and preferably around 200~600 μm. In the magnetic sensor device 1 according to the embodiment, the magnetic particles 7 substantially do not exist in a portion of the sealing body 6, as described below. The portion in which the magnetic particles 7 substantially do not exist is formed by making the thickness of the sealing body 6 less than the particle diameter of the magnetic particles 7. If the particle diameter of the magnetic particles 7 is less than 200 μm, the thickness of the sealing body 6 in the portion where the magnetic particles 7 substantially do not exist becomes less than this particle diameter (less than 200 μm), so there is a risk that the intensity of the magnetic sensor device 1 will be insufficient. On the other hand, if the particle diameter of the magnetic particles 7 exceeds 600 μm, there is a risk that it is difficult to uniformly disperse in the resin composing the sealing body 6. The particle diameter of the magnetic particles 7, for example, can be measured through observation using a scanning electronic microscope (SEM). Magnetic particles 7 of the prescribed particle diameter are obtained through a grading process using a sieve of a prescribed aperture size. That is, the particle diameter of the magnetic particles 7 is the smallest particle diameter of the magnetic particles 7 having a prescribed particle distribution, obtained through a grading process. The smallest particle diameter means the average value of the smallest particle diameters resulting from measurement of the particle diameter of the magnetic particles 7 using the above-described scanning electron microscope (SEM) from a plurality of views (for example, around five views).

The sealing body 6 includes a first sealing part 61 and a second sealing part 62 respectively positioned at the first side surface 21 and the second side surface 22 side of the magnetic sensor chip 2 having a roughly rectangular shape in the plan view, and third through sixth sealing parts 63~66, which are respectively positioned at the four surface (the third side surface 23, the fourth side surface 24, the top surface 25 and the bottom surface 26) sides other than the first side surface 21 and the second side surface 22. The first sealing part 61, the second sealing part 62, the fifth sealing part 65 and the sixth sealing part 66 are sealing parts without magnetic particle content and do not contain the magnetic particles 7, while the third sealing part 63 and the fourth sealing part 64 are sealing sections with magnetic particle content and contain the magnetic particles 7.

The thicknesses $T_{61}$ and $T_{62}$ of the first sealing part 61 and the second sealing part 62 are smaller than the particle diameter of the magnetic particles 7. Through this, it is possible for the first sealing part 61 and the second sealing part 62 the sealing sections without magnetic particle content and substantially do not contain the magnetic particles 7. On the other hand, the thicknesses $T_{63}$ and $T_{64}$ of the third sealing part 63 and the fourth sealing part 64 are larger than the particle diameter of the magnetic particles 7. Through this, it is possible for the magnetic particles 7 to exist in the third sealing part 63 and the fourth sealing part 64, and it is possible for these sealing parts to be the sealing parts with magnetic particle content. By having this kind of configuration, the magnetic particles 7 existing in the third sealing part 63 and the fourth sealing part 64 can function as a magnetic shield that reduces the magnetic field intensity of the magnetic field in the X-axis direction and can function as a magnetic yoke that increases the magnetic field intensity of the magnetic field in the Y-axis direction.

In the magnetic sensor device 1 shown in FIG. 5, the thicknesses $T_{63}$ and $T_{64}$ of the third sealing part 63 and the fourth sealing part 64 respectively positioned on the third side surface 23 and the fourth side surface 24 are smaller than the particle diameter of the magnetic particles 7. As a result, the magnetic particles 7 substantially do not exist in the third sealing part 63 and the fourth sealing part 64, and it is possible for the third sealing part 63 and the fourth sealing part 64 to be sealing parts without magnetic particle content. On the other hand, the thicknesses $T_{65}$ and $T_{66}$ of the fifth sealing part 65 and the sixth sealing part 66, which are respectively positioned at the top surface 25 side and the bottom surface 26 side, are larger than the particle diameter of the magnetic particles 7, so it is possible for the fifth sealing part 65 and the sixth sealing part 66 to be the sealing parts with magnetic particle content. Accordingly, in the magnetic sensor device 1 shown in FIG. 5, when the sensitivity axis of the magnetic sensor chip 2 (the sensitivity axis of the magnetic sensor element) is in the direction between the top surface 25 and the bottom surface 26 (the Z-axis direction) (for example, when the magnetic sensor element is a Hall element or the like), the magnetic particles 7 existing in the fifth sealing part 65 and the sixth sealing part 66 can function as a magnetic yoke that increases the magnetic field intensity of the magnetic field in the Z-axis direction.

In the magnetic sensor device 1 shown in FIG. 2 through FIG. 4, when the sensitivity axis of the magnetic sensor chip 2 (the sensitivity axis of the magnetic sensor element) is in the direction between the third side surface 23 and the fourth side surface 24 (the Y-axis direction), the thicknesses $T_{65}$ and $T_{66}$ of the fifth sealing part 65 and the sixth sealing part 66 respectively positioned on the top surface 25 and the bottom surface 26 sides may be smaller than the particle diameter of the magnetic particles 7 (see FIG. 2, FIG. 3), or may be larger than the particle diameter (see FIG. 4). Since the thicknesses $T_{65}$ and $T_{66}$ of the fifth sealing part 65 and the sixth sealing part 66 are smaller than the particle diameter of the magnetic particles 7, it is possible to allow substantially no magnetic particles 7 to exist in the fifth sealing part 65 and the sixth sealing part 66, and it is possible for the fifth sealing part 65 and the sixth sealing part 66 to be sealing sections without magnetic particle content (see FIG. 2, FIG. 3).

On the other hand, when the sensitivity axis of the magnetic sensor chip 2 (the sensitivity axis of the magnetic sensor element) is in the direction between the first side surface 21 and the second side surface 22 (the X-axis direction), it is preferable for the thicknesses $T_{65}$ and $T_{66}$ of the fifth sealing part 65 and the sixth sealing part 66 to be smaller than the particle diameter of the magnetic particles 7 (see FIG. 2, FIG. 3). When the thicknesses $T_{65}$ and $T_{66}$ of the fifth sealing part 65 and the sixth sealing part 66 are larger than the particle diameter of the magnetic particles 7, the magnetic particles 7 exist in the fifth sealing part 65 and the sixth sealing part 66, and the fifth sealing part 65 and the sixth sealing part 66 are made to be sealing parts with magnetic particle content (see FIG. 4), the function as the magnetic shield to reduce the magnetic field intensity in the X-axis direction cannot be effectively exerted, and there is a possibility that it is difficult to adjust the magnetic field intensity in the X-axis direction within the usable magnetic field range of the magnetic sensor element.

When the third sealing part 63 and the fourth sealing part 64, which are respectively positioned on the third side surface 23 and the fourth side surface 24 sides of the magnetic sensor chip 2, are sealing parts with magnetic particle content (see FIG. 2 through FIG. 4), the thickness $T_1$ of the magnetic sensor device 1 in the third sealing part 63 and the fourth sealing part 64 may be substantially the same as the thickness of the magnetic sensor device 1 in the other portions (see FIG. 2 and FIG. 4), or may be thicker than the thickness of the magnetic sensor device 1 in the other portions (see FIG. 3). As shown in FIG. 3, since the thickness $T_1$ of the magnetic sensor device 1 in the third sealing part 63 and the fourth sealing part 64 are thicker than the thickness in the other portions, it is possible to more effectively reduce the magnetic field intensity of the magnetic field in the X-axis direction, and it is possible to more effectively increase the magnetic field intensity of the magnetic field in the Y-axis direction.

The content ratio (mass standard) of the magnetic particles 7 and the resin material in the third sealing part 63 and the fourth sealing part 64, which are respectively positioned on the third side surface 23 and the fourth side surface 24 sides in FIG. 2 through FIG. 4, and the fifth sealing part 65 and the sixth sealing part 66, which are respectively positioned on the top surface 25 and the bottom surface 26 sides in FIG. 4 and FIG. 5, that is, the sealing parts with magnetic particle content, is preferably 90:10~10:90. In particular, when the sensitivity axis of the magnetic sensor chip 2 is the X-axis direction, and when the magnetic field intensity of the magnetic field in the X-axis direction is larger than the maximum value in the usable magnetic field range of the magnetic sensor element contained in the magnetic sensor chip 2, the content ratio (mass standard) of the magnetic particles 7 and the resin material in the sealing parts with magnetic particle content (the third sealing part 63 and the fourth sealing part 64) is more preferably 80:20~25:75. On the other hand, when the sensitivity axis of the magnetic sensor chip 2 is the Y-axis direction, and when the magnetic field intensity of the magnetic field in the Y-axis direction is smaller than the minimum value in the usable magnetic field range of the magnetic sensor element contained in the magnetic sensor chip 2, the content ratio (mass standard) of the magnetic particles 7 and the resin material in the sealing parts with magnetic particle content (the third through sixth sealing parts 63~66) is more preferably 70:30~20:80. When the content ratio of the magnetic particles 7 and the resin material in the sealing parts with magnetic particle content is outside the above-described range, there is a possibility that the magnetic field intensity of the magnetic field in the sensitivity axis direction of the magnetic sensor chip 2 will deviate from the usable magnetic field range of the magnetic sensor element contained in the magnetic sensor chip 2.

The magnetic sensor chip 2 in the embodiment includes at least one magnetic sensor element. The magnetic sensor chip 2 may include a pair of magnetic sensor elements connected in series, as the at least one magnetic sensor element. In this case, the magnetic sensor chip 2 has a first Wheatstone bridge circuit C11 and a second Wheatstone bridge circuit C21 containing first and second magnetic sensor elements R11 and R12, which are connected in series, and third and fourth magnetic sensor elements R13 and R14, which are connected in series.

Figure 6:
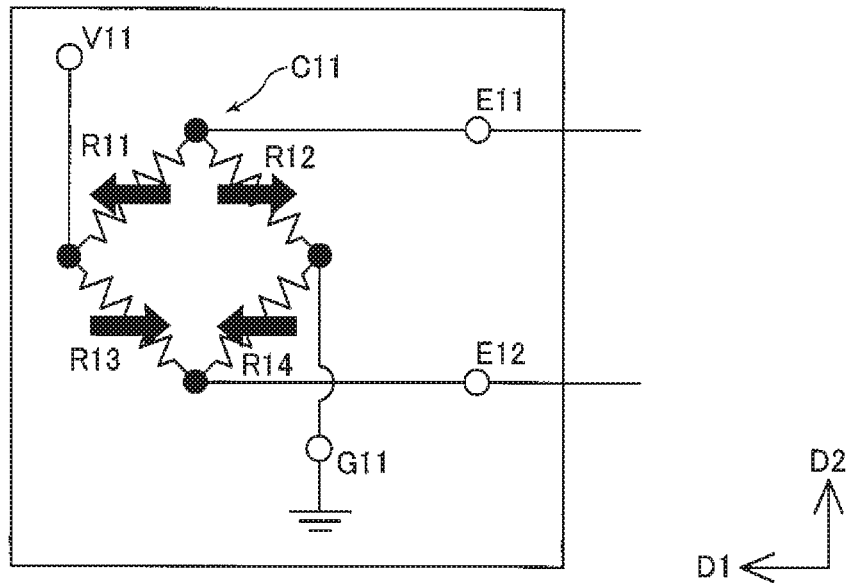
FIG. 6 is a circuit diagram schematically showing a configuration of a first Wheatstone bridge of the magnetic sensor chip in an embodiment of the present invention.

As shown in FIG. 6, the first Wheatstone bridge circuit C11 that the magnetic sensor chip 2 has includes a power source port V11, a ground port G11, two output ports E11 and E12, the first and second magnetic sensor elements R11 and R12, which are connected in series, and the third and fourth magnetic sensor elements R13 and R14, which are connected in series. One end of each of the first and third magnetic sensor elements R11 and R13 is connected to the power source port V11. The other end of the first magnetic sensor element R11 is connected to one end of the second magnetic sensor element R12 and the output port E11. The other end of the third magnetic sensor element R13 is connected to one end of the fourth magnetic sensor element R14 and the output port E12. The other ends of the second and fourth magnetic sensor elements R12 and R14 are connected to the ground port G11, respectively. A power source voltage of a prescribed size is applied to the power source port V11, and the ground port G11 is connected to the ground.

Figure 7:
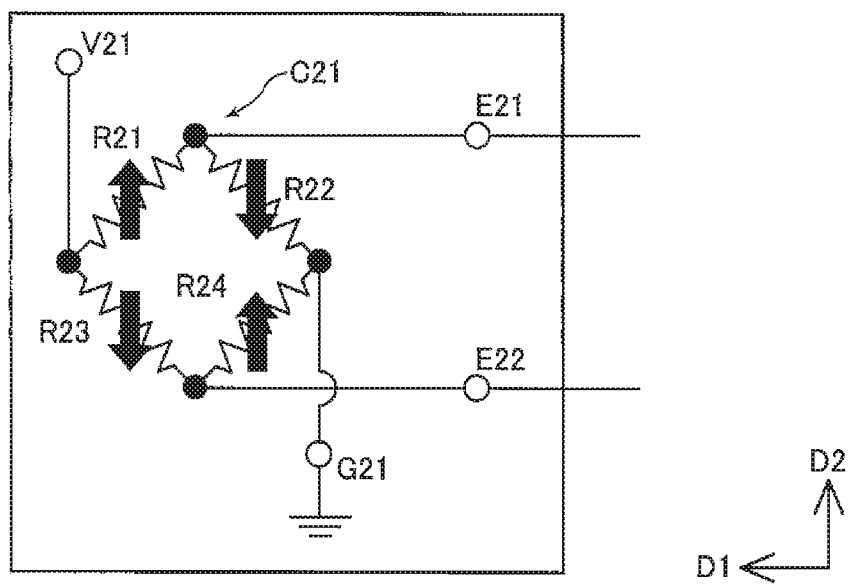
FIG. 7 is a circuit diagram schematically showing a configuration of a second Wheatstone bridge of the magnetic sensor chip in an embodiment of the present invention.

As shown in FIG. 7, the second Wheatstone bridge circuit C21 includes a power source port V21, a ground port G21, two output ports E21 and E22, first and second magnetic sensor elements R21 and R22 connected in series, and third and fourth magnetic sensor elements R23 and R24 connected in series. One end of each of the first and third magnetic sensor elements R21 and R23 is connected to the power source port V21. The other end of the first magnetic sensor element R21 is connected to one end of the second magnetic sensor element R22 and the output port E21. The other end of the third magnetic sensor element R23 is connected to one end of the fourth magnetic sensor element R24 and the output port E22. The other ends of the second and fourth magnetic sensor elements R22 and R24 are connected to the ground port G21, respectively. A power source voltage of a prescribed size is applied to the power source port V21, and the ground port G21 is connected to the ground.

In this embodiment, it is possible to use Hall elements, AMR elements, GMR elements, TMR elements or the like as the first through fourth magnetic sensor elements R11~R14 and R21~R24 contained in the first and second Wheatstone bridge circuits C11 and C12, and, in particular, it is preferable to use TMR elements.

In FIG. 6 and FIG. 7, the magnetization directions of a magnetization fixed layers 83 (see FIG. 9) of the TMR elements R11~R14 and R21~R24 are indicated by filled-in arrows. In the first Wheatstone bridge circuit C11, the magnetization directions of the magnetization fixed layers 83 of the TMR elements R11~R14 are parallel to a first direction D1, and the magnetization directions of the magnetization fixed layers 83 of the TMR elements R11 and R14, and the magnetization directions of the magnetization fixed layers 83 of the TMR elements R12 and R13 are mutually antiparallel directions. In the second Wheatstone bridge circuit C12, the magnetization directions of the magnetization fixed layers 83 of the TMR elements R21~R24 are parallel to a second direction D2, and the magnetization directions of the magnetization fixed layers 83 of the TMR elements R21 and R24, and the magnetizations direction of the magnetization fixed layers 83 of the TMR elements R22 and R23 are mutually antiparallel directions.

Figure 8:
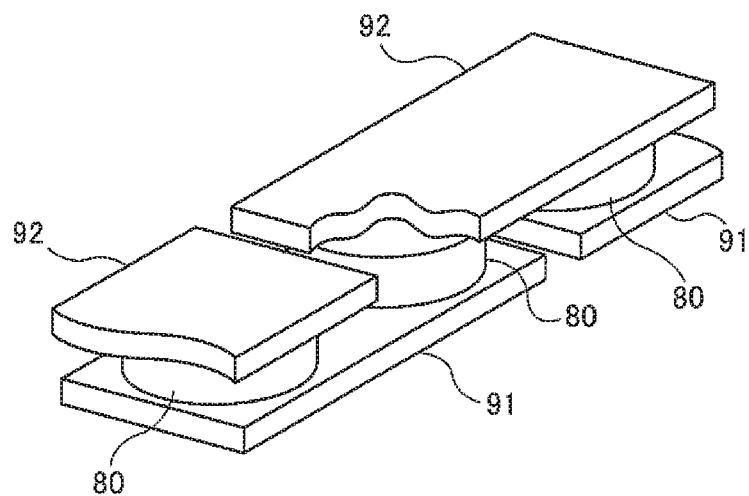
FIG. 8 is a perspective view showing the schematic configuration of a TMR element in an embodiment of the present invention.

As shown in FIG. 8, the TMR elements have a plurality of lower lead electrodes 91, a plurality of TMR laminated bodies 80 and a plurality of upper lead electrodes 92. The lower lead electrodes 91 and the upper lead electrodes 92 are composed of one type of conductive material among Cu, Al, Au, Ta, Ti or the like or a composite film of two or more types of conductive materials, and the thickness thereof is around 0.3~2.0 each.

The plurality of lower lead electrodes 91 is provided on a substrate (unrepresented). Each of the plurality of lower lead electrodes 91 has a long, slender, roughly rectangular shape and is provided to have a prescribed gap between two adjacent lower lead electrodes 91 in the electrical series direction of the plurality of TMR laminated bodies 80 arranged in an array. Near both ends of the lower lead electrodes 91 in the lengthwise direction, the TMR laminated bodies 80 are provided. That is, two TMR laminated bodies 80 are provided on each of the plurality of lower lead electrodes 91. In the TMR elements, the plurality of TMR laminated bodies 80 arranged in an array may not be electrically connected in series and may be configured by one lower lead electrode 91, one TMR laminated body 80, and one upper lead electrode 92. In addition, the plan view shape of the TMR laminated body 80 shown in FIG. 8 is a roughly circular shape, but it is not limited to this state, and other shapes, for example, a substantially square shape or the like, may be used as long as the resistance value can be changed within the desired range.

Figure 9:
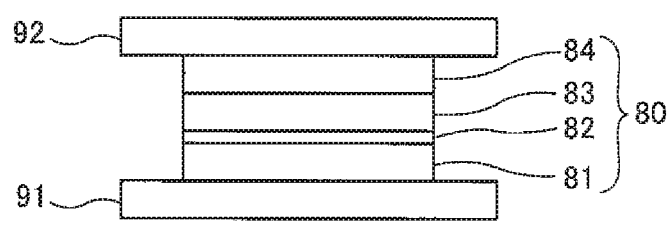
FIG. 9 is a cross-sectional view showing the schematic configuration of a TMR element in an embodiment of the present invention.

The TMR laminated bodies 80 according to this embodiment have a magnetization fixed layer 83 in which the magnetization direction is fixed, a free layer 81 in which the magnetization direction changes in accordance with the direction of an applied magnetic field, a nonmagnetic layer 82 positioned between the magnetization fixed layer 83 and the free layer 81, and an antiferromagnetic layer 84, as shown in FIG. 9.

The TMR laminated bodies 80 have a structure in which the free layer 81, the nonmagnetic layer 82, the magnetization fixed layer 83 and the antiferromagnetic layer 84 are laminated in that order from the lower lead electrode 91 side. The free layer 81 is electrically connected to the lower lead electrode 91, and the antiferromagnetic layer 84 is electrically connected to the upper lead electrode 92. Examples of materials composing the free layer 81 and the magnetization fixed layer 83 include NiFe, CoFe, CoFeB, CoFeNi, $Co_2MnSi$, $Co_2MnGe$, $FeO_x$ (oxides of Fe), or the like. The thicknesses of the free layer 81 and the magnetization fixed layer 83 are around 1~10 nm each.

The nonmagnetic layer 82 is a tunnel bather layer and is an essential film for causing the tunnel magnetoresistance effect (TMR effect) to appear in the TMR laminated body 80. Examples of materials composing the nonmagnetic layer 82 can be Cu, Au, Ag, Zn, Ga, TiOx, ZnO, InO, SnO, GaN, ITO (Indium Tin Oxide), $Al_2O_3$, MgO, or the like. The nonmagnetic layer 82 may be composed of a laminated film of two or more layers. For example, the nonmagnetic layer 82 may be composed of a three-layer laminated film of Cu/ZnO/Cu, or a three-layer laminated film of Cu/ZnO/Zn in which one of the Cu is replaced with Zn. The thickness of the nonmagnetic layer 82 is around 0.1~5 nm.

The antiferromagnetic layer 84 is composed of antiferromagnetic materials containing Mn and at least one type of element selected from a group of Pt, Ru, Rh, Pd, Ni, Cu, Ir, Cr and Fe, for example. The Mn content in this antiferromagnetic material is, for example, around 35~95 atom %. The antiferromagnetic layer 84 composed of the antiferromagnetic material is exchange coupled with the magnetization fixed layer 83 and serves the role of fixing the direction of magnetization of the magnetization fixed layer 83.

The plurality of upper lead electrodes 92 is provided on the plurality of TMR laminated bodies 80. Each of the upper lead electrodes 92 has a long, slender, roughly rectangular shape. The upper lead electrodes 92 are provided to have a prescribed gap between two adjacent upper lead electrodes 92 in the electrical series direction of the plurality of TMR laminated bodies 80 arranged in an array so that the plurality of TMR laminated bodies 80 is connected in series. The upper lead electrodes 92 electrically connect the antiferromagnetic layers 84 of two adjacent TMR laminated bodies

80 each other. The TMR laminated bodies 80 may have a configuration in which the antiferromagnetic layer 84, the magnetization fixed layer 83, the nonmagnetic layer 82 and the free layer 81 are laminated in that order from the lower lead electrode 91. In addition, a cap layer (protective layer) may be provided between the free layer 81 and the lower lead electrode 91 or the upper lead electrode 92.

In the TMR laminated bodies 80, the resistance value changes in accordance with the angle formed between the direction of magnetization of the free layer 81 and the direction of magnetization of the magnetization fixed layer 83. The resistance value becomes a minimum when this angle is 0° (when the magnetization directions are mutually parallel), and the resistance value becomes a maximum when this angle is 180° (when the magnetization directions are mutually antiparallel).

The wiring part 5 electrically connects the terminal of the magnetic sensor chip 2 and the inner lead 41, and in this embodiment, a bonding wire is used. The lead 4 is an electrode used for taking out a signal generated by the magnetic sensor chip 2 to the outside of the magnetic sensor device 1 and includes the inner lead 41, which is electrically connected to the terminal of the magnetic sensor chip 2 via the wiring part 5, and the outer lead 42, which functions as a mounting member of the magnetic sensor device 1. The inner lead 41 is the portion of the lead 4 sealed inside the sealing body 6, and the outer lead 42 is the portion exposed to the outside of the sealing body 6.

As materials composing the die pad 3 and the lead 4, there are no particular restrictions, and commonly known electrically conductive materials (for example, copper, stainless steel, aluminum, iron, ruthenium, silver or the like) or the like can be used.

In the embodiment, the lead 4 (the inner lead 41 and the outer lead 42) may be positioned on the same plane as the die pad 3 or may be positioned on a different plane from the die pad 3, in particular, on the same plane as the magnetic sensor chip 2.

The above-described magnetic sensor device 1 can be manufactured as follows, for example.

Figure 10:
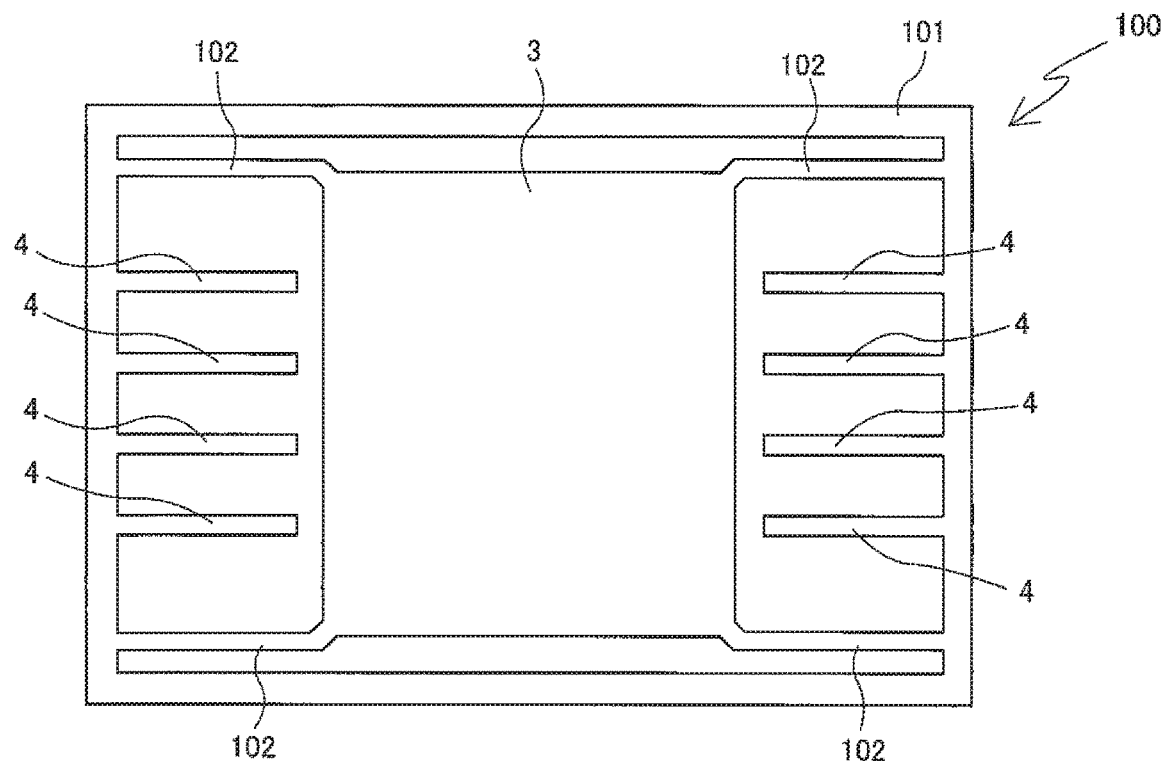
FIG. 10 is a plan view showing the schematic configuration of a lead frame used in manufacturing the magnetic sensor device according to an embodiment of the present invention.

First, a lead frame 100 (see FIG. 10) is provided with a frame part 101, the die pad 3, which is positioned inside the frame part 101, hanging leads 102, which are connected between the die pad 3 and the frame part 101, and leads 4, which are connected to the frame part 101 and positioned surrounding the die pad 3. In the embodiment, an example having one die pad 3 is given as the lead frame 100, but it is not limited to this state, and it possible to have a so-called multifaceted lead frame having a plurality of die pads 3.

Figure 11A:
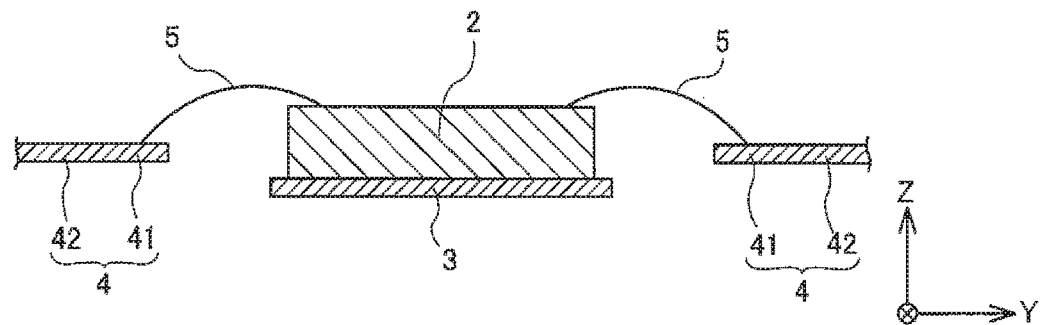
FIG. 11A and FIG. 11B are procedure flow diagrams showing the steps of the method of manufacturing the magnetic sensor device according to an embodiment of the present invention at the cut end surface.
Figure 11B:
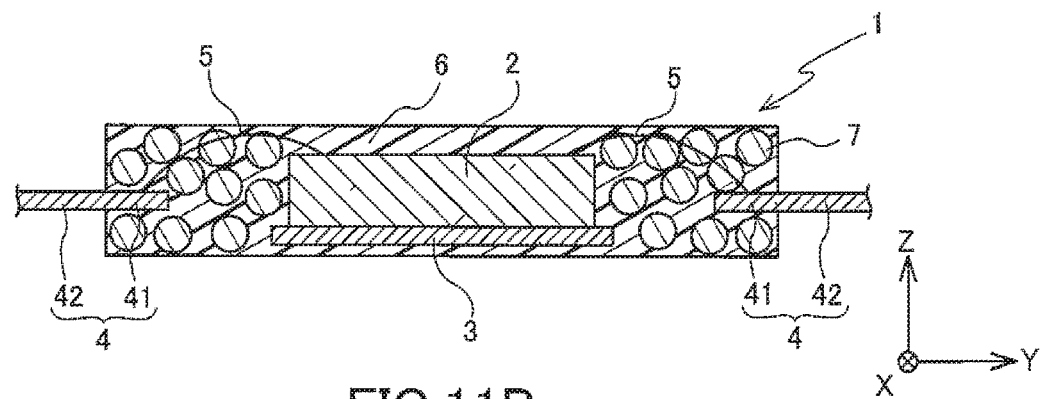

Next, the magnetic sensor chip 2 is fixed to the mounting surface of the die pad 3 of the lead frame 100, the terminal of the magnetic sensor chip 2 and the inner lead 41 are electrically connected with the wiring part 5 (see FIG. 11A), the lead frame 100 is placed in a mold, and the magnetic sensor chip 2, the die pad 3, the inner leads 41, the hanging leads 102 and the wiring parts 5 are sealed by the sealing body 6 such that the outer leads 42 are exposed to the outside (see FIG. 11B).

Because the first sealing part 61 and the second sealing part 62 are formed on the first side surface 21 and the second side surface 22 sides, respectively, by the resin that fills the gaps between the first side surface 21 and the second side surface 22 of the magnetic sensor chip 2 and the above-described inner walls of the mold, the mold in which the size of the gaps is such that the magnetic particles 7 do not exist in the first sealing part 61 and the second sealing part 62 is used. More specifically, the mold is used such that the size of the gaps between the inner walls and the first side surface 21 and the second side surface 22 is less than the particle diameter of the magnetic particles 7. Through this, by pouring resin containing the magnetic particles 7 into the mold and hardening such it is possible to prevent the magnetic particles 7 from substantially existing in the first sealing part 61 and the second sealing part 62, which are respectively formed on the first side surface 21 and the second side surface 22 sides of the magnetic sensor chip 2.

In addition, as the mold, a mold in which the size of the gaps between the inner walls thereof and the third side surface 23 and the fourth side surface 24 of the magnetic sensor chip 2 and/or the size of the gaps between the inner walls and the top surface 25 and the bottom surface 26, exceeds the particle diameter of the magnetic particles 7 can be used. Through this, it is possible to cause the magnetic particles to exist in the third sealing part 63 and the fourth sealing part 64, which are respectively formed on the third side surface 23 and the fourth side surface 24 sides of the magnetic sensor chip 2, and/or in the fifth sealing part 65 and the sixth sealing part 66, which are respectively formed on the top surface 25 and the bottom surface 26 sides (see FIG. 2 through FIG. 4).

As the above-described mold, it is also possible to use a mold in which the size of the gaps between the inner walls and the first through fourth side surfaces 21~24 of the magnetic sensor chip 2 are such that the magnetic particles 7 do not exist in the first through fourth sealing parts 61~64, which are respectively formed on the first through fourth side surface 21~24 sides, that is, such that the size of the gaps between the inner walls and the first through source side surfaces 21~24 is smaller than the particle diameter of the magnetic particles 7, and the size of the gaps between the inner walls and the top surface 25 and the bottom surface 26 exceeds the particle diameter of the magnetic particles 7. Through this, it is possible to prevent the magnetic particles substantially from existing in the first through fourth sealing parts 61~64, which are respectively formed on the first through fourth side surface 21~24 sides of the magnetic sensor chip 2, and to make the magnetic particles exist in the fifth sealing part 65 and sixth sealing part 66, which are formed on the top surface 25 and bottom surface 26 sides (see FIG. 5).

Following this, the lead frame 100, which is sealed by the sealing body 6, is removed from the mold, and the leads 4 and handing leads 102 are cut so that the outer leads 42 are exposed to the outside. In this manner, the magnetic sensor device 1 according to this embodiment is manufactured.

With the magnetic sensor device 1 according to this embodiment as described above, when the sensitivity axis of the magnetic sensor chip 2 is the X-axis direction, the first sealing part 61 and the second sealing part 62, which are respectively positioned on the first side surface 21 and the second side surface 22, where the detected magnetic field can be introduced to the magnetic sensor chip 2, substantially do not contain the magnetic particles 7, and the third sealing part 63 and the fourth sealing part 64 contain the magnetic particles 7, so the function as a magnetic shield to reduce the magnetic field intensity of the magnetic field in the X-axis direction is exerted by the third sealing part 63 and the fourth sealing part 64, which contain the magnetic particles 7. If the magnetic particles 7 are contained in the fifth sealing part 65 and the sixth sealing part 66, it is difficult to adjust the magnetic field intensity of the magnetic field in the X-axis direction within the useable magnetic field intensity range of the magnetic sensor elements, so it is preferable for the magnetic particles 7 not to be contained (not to exist) in the fifth sealing part 65 and the sixth sealing part 66. On the other hand, when the sensitivity axis of the magnetic sensor chip 2 is the Y-axis direction, the function as a magnetic yoke to increase the magnetic field intensity of the magnetic field in the Y-axis direction is exerted by the third sealing part 63 and the fourth sealing part 64, which contain the magnetic particles 7. In addition, when the sensitivity axis of the magnetic sensor chip 2 is the Z-axis direction, the function as a magnetic yoke to increase the magnetic field intensity of the magnetic field in the Z-axis direction is exerted by the fifth sealing part 65 and the sixth sealing part 66, which contain the magnetic particles 7. Furthermore, it is not necessary for the magnetic shield and the magnetic yoke that exerts the magnetic shield function and the magnetic yoke function to be provided separately, so it is possible to make the overall size of the magnetic sensor device 1 more compact, and it is also possible to inexpensively manufacture the magnetic sensor device 1.

The embodiment described above was described to facilitate understanding of the present invention and is not intended to limit the present invention. Accordingly, the various elements disclosed in the above-described embodiment are intended to include all design modifications and equivalences belonging within the technical scope of the present invention.

Figure 12:
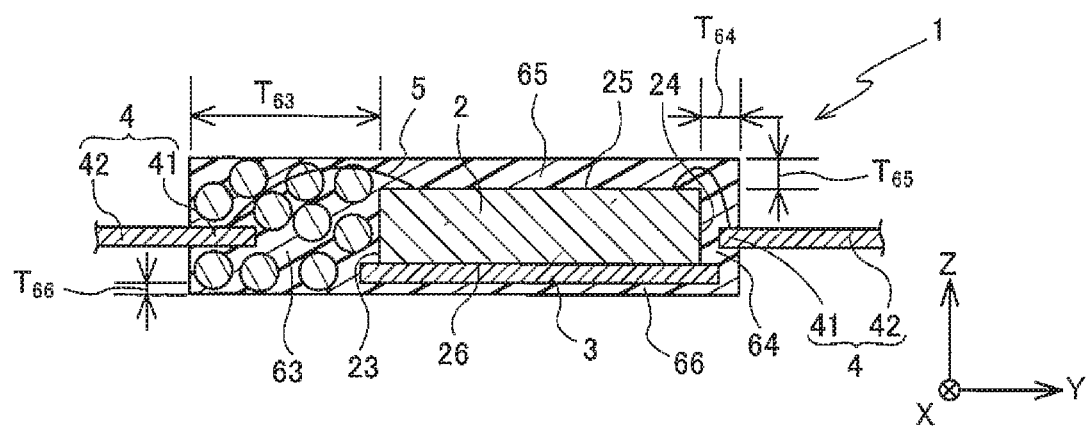
FIG. 12 is a cross-sectional view showing the schematic configuration of the magnetic sensor device according to another embodiment of the present invention.

In the above-described embodiment, the explanation was given taking as an example a configuration in which the magnetic particles 7 exist in the third sealing part 63 and the fourth sealing part 64 respectively positioned on the third side surface 23 and fourth side surface 24 sides of the magnetic sensor chip 2, but the invention is not limited to such a state. For example, as shown in FIG. 12, it is fine for the magnetic particles 7 to exist in the sealing part (the third sealing part 63) positioned on either one of the side surfaces (for example, the third side surface 23), and for the magnetic particles 7 to substantially not exist in the sealing part (the fourth sealing part 64) positioned on the other side surface (for example, the fourth side surface 24).

EXAMPLES

Below, the present invention is described in greater detail by citing examples, but the present invention is not limited in any way by the below-described examples.

Example 1

The magnetic sensor device 1 having the configuration shown in FIG. 3 was produced in accordance with the manufacturing method shown in FIG. 11A and FIG. 11B. As the magnetic particles 7, $\gamma$-$Fe_2O_3$ particles (particles graded using a sieve with a 212 μm aperture (65 mesh)) were used, and epoxy resin was used as the resin material composing the sealing body 6. Using a mold such that the thicknesses $T_{61}$ and $T_{62}$ of the first sealing part 61 and the second sealing part 62 are 200 μm, the thicknesses $T_{63}$ and $T_{64}$ of the third sealing part 63 and the fourth sealing part 64 (sealing parts with magnetic particle content) are 600 μm, the thicknesses $T_{65}$ and $T_{66}$ of the fifth sealing part 65 and the sixth sealing part 66 (sealing parts without magnetic particle content) are 200 μm, and the thickness $T_1$ of the magnetic sensor device 1 in the sealing parts with magnetic particle content (the third sealing part 63 and the fourth sealing part 64) is 1 mm, the amount of magnetic particles 7 contained in the resin material poured into the mold was adjusted so that the content ratio (mass standard) of the magnetic particles 7 and the resin material in the sealing parts with magnetic particle content was 90:10.

Example 2

The magnetic sensor device 1 was produced the same as in Example 1, other than that the amount of the magnetic particles 7 in the resin material poured into the mold was adjusted so that the content ratio (mass standard) of the magnetic particles 7 and the resin material in the sealing parts with magnetic particle content was 80:20.

Example 3

The magnetic sensor device 1 was produced the same as in Example 1, except that the amount of the magnetic particles 7 in the resin material poured into the mold was adjusted so that the content ratio (mass standard) of the magnetic particles 7 and the resin material in the sealing parts with magnetic particle content was 70:30.

Example 4

The magnetic sensor device 1 was produced the same as in Example 1, except that the amount of the magnetic particles 7 in the resin material poured into the mold was adjusted so that the content ratio (mass standard) of the magnetic particles 7 and the resin material in the sealing parts with magnetic particle content was 50:50.

Example 5

The magnetic sensor device 1 was produced the same as in Example 1, except that the amount of the magnetic particles 7 in the resin material poured into the mold was adjusted so that the content ratio (mass standard) of the magnetic particles 7 and the resin material in the sealing parts with magnetic particle content was 25:75.

Example 6

The magnetic sensor device 1 was produced the same as in Example 1, except that the amount of the magnetic particles 7 in the resin material poured into the mold was adjusted so that the content ratio (mass standard) of the magnetic particles 7 and the resin material in the sealing parts with magnetic particle content was 20:80.

Example 7

The magnetic sensor device 1 was produced the same as in Example 1, except that the amount of the magnetic particles 7 in the resin material poured into the mold was adjusted so that the content ratio (mass standard) of the magnetic particles 7 and the resin material in the sealing parts with magnetic particle content was 10:90.

Example 8

The magnetic sensor device 1 was produced the same as in Example 1, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Example 9

The magnetic sensor device 1 was produced the same as in Example 2, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Example 10

The magnetic sensor device 1 was produced the same as in Example 3, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Example 11

The magnetic sensor device 1 was produced the same as in Example 4, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Example 12

The magnetic sensor device 1 was produced the same as in Example 5, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Example 13

The magnetic sensor device 1 was produced the same as in Example 6, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Example 14

The magnetic sensor device 1 was produced the same as in Example 7, except that a mold was used to change to the configuration shown in FIG. 4 and so that the thicknesses $T_{65}$ and $T_{66}$ of the fifth sealing part 65 and the sixth sealing part 66 (sealing parts without magnetic particle content) became 600 μm.

Comparison Example 1

A magnetic sensor device was produced the same as in Example 1, except that a mold was used so that the thicknesses $T_{61}$ and $T_{62}$ of the first sealing part 61 and the second sealing part 62 became 300 μm, the thicknesses $T_{63}$, $T_{64}$, $T_{65}$ and $T_{66}$ of the third through sixth sealing parts 63~66 became 300 μm and the height $T_1$ of the magnetic sensor device became 300 μm.

Comparison Example 2

A magnetic sensor device was produced the same as in Comparison Example 1, except that resin material not containing magnetic particles (epoxy resin) was used.

Test Example 1

The magnetic field intensities (mT) of magnetic fields in the X-axis direction and Y-axis direction introduced to a magnetic sensor chip were measured in an atmosphere of an external magnetic field having a static magnetic field intensity of 200 mT (magnetic field intensity in the X-axis direction: 200 mT; magnetic field intensity in the Y-axis direction: 5 mT), for the magnetic sensor devices of Examples 1~14 and Comparison Examples 1~2. Results are shown in Table 1.

TABLE 1

| | Magnetic field (mT) | |
|---|---|---|
| | X-axis direction | Y-axis direction |
| Example 1 | 10 | 120 |
| Example 2 | 20 | 100 |
| Example 3 | 35 | 50 |
| Example 4 | 40 | 40 |
| Example 5 | 50 | 35 |
| Example 6 | 100 | 20 |
| Example 7 | 120 | 10 |
| Example 8 | 5 | 120 |
| Example 9 | 8 | 100 |
| Example 10 | 10 | 50 |
| Example 11 | 13 | 40 |
| Example 12 | 15 | 35 |
| Example 13 | 18 | 20 |
| Example 14 | 180 | 10 |
| Comparison example 1 | 5 | 120 |
| Comparison example 2 | 200 | 5 |

As is clear from the results shown in Table 1, it was confirmed that by having no magnetic particles 7 contained in the first sealing part 61 and the second sealing part 62, which are respectively positioned on the first side surface 21 and the second side surface 22 sides of the magnetic sensor chip 2, and no magnetic particles 7 in the fifth sealing part 65 and the sixth sealing part 66, which are respectively positioned on the top surface 25 and the bottom surface 26 sides, and having the magnetic particles 7 contained in the third sealing part 63 and the fourth sealing part 64, which are respectively positioned on the third side surface 23 and the fourth side surface 24 sides, and by making the third sealing part 63 and the fourth sealing part 64 sealing parts with magnetic particle content, the magnetic shield function to reduce the magnetic field intensity of the magnetic field in the X-axis direction can be exerted without separately providing a magnetic shield, and the magnetic yoke function to increase the magnetic field intensity in the Y-axis direction can be exerted. On the other hand, it was confirmed that when the magnetic particles 7 are also contained in the fifth sealing part 65 and the sixth sealing part 66, which are respectively positioned on the top surface 25 and the bottom surface 26 sides, and when the fifth sealing part 65 and the sixth sealing part 66 are also sealing parts with magnetic particle content, adjusting the magnetic field intensity of the magnetic field in the X-axis direction is difficult, but at least the magnetic yoke function to increase the magnetic field intensity of the magnetic field in the Y-axis direction is exerted.

As a result, for example by using the magnetic sensor device 1 of Examples 1~7 (the magnetic sensor device 1 in which the sensitivity axis of the magnetic sensor chip 2 is the X-axis direction and the magnetic sensor elements are GMR elements or TMR elements with relatively high sensitivity) as the X-axis magnetic sensor device in a two-axis (X-axis and Y-axis) geomagnetic sensor or a three-axis (X-axis, Y-axis and X-axis) geomagnetic sensor, it is thought to be possible to adjust (decrease) the magnetic field in the X-axis direction with a magnetic field intensity (200 mT) exceeding the usable magnetic field range (for example, 20~80 mT, and ideally 20~50 mT) of the magnetic sensor elements (GMR elements or TMR elements) to within this usable magnetic field intensity and to introduce this magnetic field to the magnetic sensor chip 2. In addition, from the above results, by using the magnetic sensor device 1 in which the sensitivity axis of the magnetic sensor chip 2 is the Y-axis direction and the magnetic sensor elements are GMR elements or TMR elements of relatively high sensitivity as the Y-axis magnetic sensor device in a two-axis geomagnetic sensor or three-axis geomagnetic sensor, it is thought to be possible to adjust (increase) the magnetic field in the Y-axis direction with a weak magnetic field intensity (5 mT) that is less than the usable magnetic field range of the magnetic sensor elements and to introduce this magnetic field to the magnetic sensor chip 2.

In addition, by using the magnetic sensor device 1 in which the sensitivity axis of the magnetic sensor chip 2 of the magnetic sensor device 1 of Examples 8~12 is the Y-axis direction and the magnetic sensor elements are GMR elements or TMR elements of relatively high sensitivity as the Y-axis magnetic sensor device in a two-axis geomagnetic sensor or three-axis geomagnetic sensor, it is thought to be possible to adjust (increase) the magnetic field in the Y-axis direction with a weak magnetic field intensity (5 mT) that is less than the usable magnetic field range of the magnetic sensor elements and to introduce this magnetic field to the magnetic sensor chip 2.

Furthermore, in Examples 1~7, when the magnetic sensor devices 1 in which the third sealing part 63, which is positioned on the third side surface 23 side, is a sealing part with magnetic particle content, and the fourth sealing part 64, which is positioned on the fourth side surface 24 side, is a sealing part without magnetic particle content, are produced separately (Examples 15~21), and the magnetic field intensities (mT) of the magnetic fields in the X-axis direction and the Y-axis direction introduced to the magnetic sensor chip 2 in each of the magnetic sensor devices 1 are made the same, the magnetic field intensity (mT) of the magnetic field in the Y-axis direction had the same result as in Examples 1~7 but the magnetic field intensity (mT) of the magnetic field in the X-axis direction could not be reduced as far as in Examples 1~7. As a result, with regard to the magnetic yoke function to increase the magnetic field intensity of the magnetic field in the Y-axis direction, it was confirmed that this can be adequately exerted by causing the magnetic particles 7 to exist in either one of the third sealing part 63 or the fourth sealing part 64. On the other hand, with regard to the magnetic shield function to decrease the magnetic field intensity of the magnetic field in the X-axis direction, it was confirmed that, although this can be adequately exerted by causing the magnetic particles 7 to exist in either one of the third sealing part 63 or the fourth sealing part 64, it is preferable to cause the magnetic particles 7 to exist in both.

DESCRIPTION OF REFERENCE SYMBOLS

1 Magnetic sensor device
2 Magnetic sensor chip
21, 22 Intersecting surfaces
6 Sealing body
  61 First sealing part
  62 Second sealing part

The invention claimed is:

1. A magnetic sensor device comprising:
    a magnetic sensor chip that has a substantially rectangular shape in a plan view and that contains a magnetic sensor element; and
    a sealing body that is composed of a resin material containing magnetic particles and that integrally seals the magnetic sensor chip;
    wherein
    in the plan view of the magnetic sensor chip, the magnetic chip includes a first side surface and a second side surface that are mutually opposite to each other, and a third side surface and a fourth side surface, which are mutually opposite to each other and orthogonal to the first side surface and the second side surface;
    the sealing body contains a first sealing part, which is positioned on the first side surface, a second sealing part, which is positioned on the second side surface, a third sealing part, which is positioned on the third side surface and a fourth sealing part, which is positioned on the fourth side surface;
    the thicknesses of the first sealing part and the second sealing part are smaller than the particle diameter of the magnetic particles;
    the thickness of at least the third sealing part is larger than the particle diameter of the magnetic particles; and
    the magnetic particles exist in at least the third sealing part and substantially do not exist in the first sealing part and the second sealing part.

2. The magnetic sensor device according to claim 1, wherein:
    the direction of a sensitivity axis of the magnetic sensor element is a direction intersecting the first side surface and the second side surface;
    the magnetic sensor chip further includes a top surface and a bottom surface, which are mutually opposite to each other;
    the sealing body further contains a fifth sealing part, which is positioned on the top surface side, and a sixth sealing part, which is positioned on the bottom surface side;
    the thicknesses of the fifth sealing part and the sixth sealing part are smaller than the particle diameter of the magnetic particles; and
    the magnetic particles substantially do not exist in the fifth sealing part and the sixth sealing part.

3. The magnetic sensor device according to claim 2, wherein the content ratio of the magnetic particles and the resin material in the third sealing part is 80:20~25:75 on a mass standard.

4. The magnetic sensor device according to claim 1, wherein the direction of a sensitivity axis of the magnetic sensor element is a direction intersecting the third side surface and the fourth side surface.

5. The magnetic sensor device according to claim 4, wherein the content ratio of the magnetic particles and the resin material in the third sealing part is 70:30~20:80 on a mass standard.

6. The magnetic sensor device according to claim 4, wherein:
    the magnetic sensor chip further includes a top surface and a bottom surface that are mutually opposite to each other;

the sealing body further contains a fifth sealing part positioned on the top surface side, and a sixth sealing part positioned on the bottom surface side;

the thicknesses of the fifth sealing part and the sixth sealing part are smaller than the particle diameter of the magnetic particles; and the magnetic particles substantially do not exist in the fifth sealing part and the sixth sealing part.

7. The magnetic sensor device according to claim 4, wherein:

the magnetic sensor chip further includes a top surface and a bottom surface that are mutually opposite to each other;

the sealing body further contains a fifth sealing part positioned on the top surface side, and a sixth sealing part positioned on the bottom surface side;

the thicknesses of the fifth sealing part and the sixth sealing part are larger than the particle diameter of the magnetic particles; and the magnetic particles exist in the fifth sealing part and the sixth sealing part.

8. The magnetic sensor device according to claim 7, wherein the content ratio of the magnetic particles and the resin material in the fifth sealing part and the sixth sealing part is 70:30~20:80 on a mass standard.

9. The magnetic sensor device according to claim 1, wherein:

the thickness of the fourth sealing part is larger than the particle diameter of the magnetic particles; and the magnetic particles also exist in the fourth sealing part.

10. The magnetic sensor device according to claim 1, wherein the particle diameter of the magnetic particles is 200 µm or larger.

11. The magnetic sensor device according to claim 1, wherein the resin material is epoxy resin, styrene resin or ABS resin.

12. The magnetic sensor device according to claim 1, wherein the magnetic sensor chip contains a magnetoresistance effect element as the magnetic sensor element.

13. The magnetic sensor device according to claim 12, wherein the magnetoresistance effect element is a Hall element, an AMR element, a GMR element or a TMR element.

* * * * *